(12) United States Patent
Kotake et al.

(10) Patent No.: US 8,791,173 B2
(45) Date of Patent: Jul. 29, 2014

(54) INK COMPOSITION FOR FORMING INSULATING FILM AND INSULATING FILM FORMED FROM THE INK COMPOSITION

(75) Inventors: Masayoshi Kotake, Chiba (JP); Hideki Etori, Sakura (JP); Toshihiro Ebine, Ichikawa (JP); Hiroshi Isozumi, Tokyo (JP); Masanori Kasai, Tokyo (JP)

(73) Assignee: DIC Corporation, Tokyo (JP)

( * ) Notice: Subject to any disclaimer, the term of this patent is extended or adjusted under 35 U.S.C. 154(b) by 11 days.

(21) Appl. No.: 12/737,145

(22) PCT Filed: Jun. 3, 2009

(86) PCT No.: PCT/JP2009/060129
§ 371 (c)(1),
(2), (4) Date: Dec. 13, 2010

(87) PCT Pub. No.: WO2009/150972
PCT Pub. Date: Dec. 17, 2009

(65) Prior Publication Data
US 2011/0086946 A1 Apr. 14, 2011

(30) Foreign Application Priority Data
Jun. 13, 2008 (JP) ................................. 2008-155238

(51) Int. Cl.
*C09D 11/10* (2014.01)

(52) U.S. Cl.
USPC .......................................... 523/160; 523/161

(58) Field of Classification Search
USPC ................................................. 523/160, 161
See application file for complete search history.

(56) References Cited

U.S. PATENT DOCUMENTS

| | | | | |
|---|---|---|---|---|
| 4,510,279 A | * | 4/1985 | Kishimura et al. | 524/144 |
| 2003/0064319 A1 | * | 4/2003 | Saito et al. | 430/270.1 |
| 2006/0199099 A1 | * | 9/2006 | Arao et al. | 430/270.1 |
| 2007/0120923 A1 | * | 5/2007 | Kovacs et al. | 347/100 |

FOREIGN PATENT DOCUMENTS

| | | | |
|---|---|---|---|
| EP | 0166588 A1 | | 1/1986 |
| EP | 1698936 A2 | | 9/2006 |
| EP | 1892574 A1 | | 2/2008 |
| JP | 07-034022 A | | 2/1995 |
| JP | 2001-192539 A | | 7/2001 |
| JP | 2002-040632 A | | 2/2002 |
| JP | 2005-126608 A | | 5/2005 |
| JP | 2005-128346 | * | 5/2005 |
| JP | 2005-128346 A | | 5/2005 |
| JP | 2007-273712 A | | 10/2007 |
| JP | 2007-305950 A | | 11/2007 |

OTHER PUBLICATIONS

Machine translation of JP 2005-128436.*
C. D. Dimitrakopoulos et al., "Organic Thin Film Transistors for Large Area Electronics," Advanced Materials, 2002, 14, No. 2, pp. 99-117.
J. Veres et al., "Gate Insulators in Organic Field-Effect Transistors," Chemistry of Materials, 2004, 16, pp. 4543-4555.
J. A. Rogers et al., "Nonphotolithographic fabrication of organic transistors with micron feature sizes," Applied Physics Letters, 1998, vol. 72, No. 21, pp. 2716-2718.
H. Klauk et al., "High-mobility polymer gate dielectric pentacene thin film transistors," Journal of Applied Physics, 2002, vol. 92, No. 9, pp. 5259-5263.
C. Kim et al., Polymer Gate Dielectric Surface Viscoelasticity Modulates Pentacene Transistor Performance, Science, 2007, vol. 318, pp. 76-80.
J. H. Lee et al., "Organic Thin-Film Transistors Fabricated on Plastic Substrates with a Polymeric Gate Dielectrics," Japanese Journal of Applied Physics, 2003, vol. 42, pp. L523-L525.
Notice of Reasons for Rejection mailed Mar. 16, 2010, issue for Japanese Patent Application No. 2010-501307 and Partial English translation thereof.
T.-W. Lee et al., "Photocurable Organic Gate Insulator for the Fabrication of High-Field Effect Mobility Organic Transistors by Low Temperature and Solution Processing," Advanced Materials, vol. 19, No. 18, Sep. 17, 2007, pp. 2702-2706.
XP-002685138, Database WPI Week 200230, Thomson Scientific, London, GB; AN 2002-245992, XP002685138, -& JP 2001 192539 A (JSR CORP), Jul. 17, 2001, abstract, paragraphs [0052],[0060].
S. H. Kim et al., "Hysteresis-free pentacene field-effect transistors and inverters containing poly(4-vinyl phenol-co-methyl methacrylate) gate dielectrics," Applied Physics Letters, AIP, vol. 92, No. 18, May 9, 2008, pp. 183306-1 to 183306-3.
D. K. Hwang et al., "Comparative studies on the stability of polymer versus Si02 gate dielectrics for pentacene thin-film transistors," Applied Physics Letters, AIP, vol. 89, No. 9, Sep. 1, 2006, pp. 093507-1 to 093507-3.
XP-002685139, Database WPI Week 200539, Thomson Scientific, London, GB, AN 2005-376945, XP002685139, -& JP 2005 128346 A (Dainippon Ink & Chem Inc) May 19, 2005, the whole document.
Supplementary European Search Report dated Oct. 31, 2012, issued for the corresponding European Patent Application No. 09764202.7.

* cited by examiner

*Primary Examiner* — Doris Lee
(74) *Attorney, Agent, or Firm* — Edwards Wildman Palmer LLP; James E. Armstrong, IV

(57) ABSTRACT

An insulating ink composition for forming an insulating film, which sufficiently achieves a low calcination temperature, solvent resistance and an insulating property, is provided. Furthermore, an ink composition for forming an insulating film which can form, by the printing method, fine insulating film patterns necessary for formation of highly integrated organic transistors is provided. The present invention provides an ink composition which forms an insulating film, and includes an organic solvent, a polyvinylphenol-based resin, an epoxy resin and a cross-linking aid. Particularly, the ink composition is a composition wherein the organic solvent includes an organic solvent which has a vapor pressure of $11.3 \times 10^2$ Pa or higher at 20° C. and a boiling point of lower than 115° C. under atmospheric pressure and an organic solvent which has a vapor pressure of less than $11.3 \times 10^2$ Pa at 20° C. and a boiling point of 115° C. or higher under atmospheric pressure; the ink composition includes a extender component having a volume average particle diameter of 1 to 150 nm and a silicone-based releasing component.

18 Claims, 1 Drawing Sheet

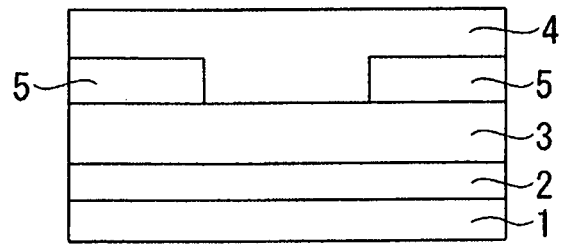

INK COMPOSITION FOR FORMING INSULATING FILM AND INSULATING FILM FORMED FROM THE INK COMPOSITION

TECHNICAL FIELD

The present invention relates to an ink composition for forming an insulating film, which can be used for production of an electronic device, and an insulating film formed from the ink composition.

BACKGROUND ART

Transistors are extensively used as an important electronic device (electronic component) which constitutes televisions or computer equipment, and today, they are produced using inorganic substances such as silicon as a main material. Recently, an organic transistor (OFET) using organic substances as the transistor member (refer to Non Patent Document 1) has attracted attention. OFET is soft and flexible, and has an advantageous benefit in that raw materials of OFET can be produced at low cost per unit area since raw materials of OFET is inexpensive; therefore, OFET is considered to be an indispensible item for the make up of ubiquitous computing age, that is, an essential component for realizing flexible and low-cost terminals.

OFET is an electronic device which includes three electrodes, an insulating layer, and a semiconductor layer as essential members. An example of the device structure is shown in FIG. 1. Although a method for forming a gate insulating layer (GI), which corresponds to a reference number 3 in the FIGURE, includes a wet process such as a printing method and a dry process such as vacuum deposition or sputtering, the wet process is preferable to lower the cost (refer to Non Patent Document 2). Meanwhile, usually, it is necessary for the wet process to go through a superheating (sintering) process after the film is produced. When flexible materials having a low heat resistance temperature are used for substrates, it is required for the superheating (calcination) process to be conducted at a lower temperature. For example, when polyethylene naphthalate (PEN) is used for a substrate, the calcination temperature needs to be 150° C. or lower. Also, when the printing method is applied to the wet process, it is required for ink which is used for forming an insulating film to have an excellent printing property in order to facilitate the formation of a fine pattern.

Meanwhile, among various properties required for the GI itself, there are properties which concern a device production process, and properties which concern the electric property (FET property) of a device. As an example of the former, there is a property of insolubility to a solvent (that is, solvent resistance) which is used for an organic semiconductor layer placed on the GI. As an example of the latter, it is considered that, in the state of a thin film, the higher the insulating property (leakage current is small) and degree of surface smoothness, the more the device property is improved. As materials for forming the insulating film, for example, a polyvinylphenol-based material (I) using polyimide-based materials as a curing agent is known (refer to Non Patent Document 3); also, polyvinylphenol-based materials using melamine-based resins as a curing agent are known (refer to Non Patent Document 4).

These materials need to be processed with high-temperature calcination at about 200° C., and, usually, the materials are used when glass material is used as the substrate. However, since a feature of the materials is flexibility, it is difficult for it to be applied to a plastic substrate having a low heat resistance temperature. In order to skip the high temperature calcination process, a thermoplastic resin (II) represented by polyraethylmethacrylates and polystyrenes is also known (refer to Non Patent Document 5). However, the thermoplastic resin has poor solvent resistance, and it is difficult to laminate a conductive layer, a semiconductor layer, and the like on the thermoplastic layer by the printing method; therefore, the dry process which needs facilities for deposition or the like is required. In addition, a solid or liquid type bisphenol general-purpose epoxy resin (III) is also known (refer to Non Patent Document 6). However, it is known that an insulating film formed from this material has a large amount of leakage current. In Patent Document 1, insulating materials including a silane coupling agent and an epoxy resin are disclosed (refer to Patent Document 1). Although in Patent Document 2, a method for producing a circuit device by a letterpress plate reverse printing method is disclosed, there is no disclosure regarding low-temperature calcination (refer to Patent Document 2). Accordingly, there is no ink technique for forming an insulating film which is sufficiently equipped with an insulating property, solvent resistance, and a calcination temperature to form an electronic device by providing the insulating film on a flexible substrate. Also, in the current circumstances, there is no ink technique for forming the insulating film which has sufficient ability for forming a fine pattern.

PRIOR ART DOCUMENTS

Patent Document

Patent Document 1: Japanese Unexamined Patent Application Publication No. 2007-305950
Patent Document 2: Japanese Unexamined Patent Application Publication No. 2007-273712

Non Patent Document

Non Patent Document 1: Advanced Materials, 2002, No. 14, p. 99
Non Patent Document 2: Chemistry of Materials, 2004, No. 16, p. 4543
Non Patent Document 3: Applied Physics Letters, 1998, No. 72, p. 2716
Non Patent Document 4: Journal of Applies Physics, 2002, No. 92, p. 5239
Non Patent Document 5: Science, 2007, No. 318, p. 76
Non Patent Document 6: Japanese Journal of Applied Physics, 2003, No. 42, p. L523

SUMMARY OF INVENTION

Problem to be Solved by the Invention

A first purpose of the present invention is to provide an insulating ink composition for forming an insulating film, which sufficiently achieves a target calcination temperature, solvent resistance, and an insulating property. A second purpose of the invention is to provide an ink composition for forming an insulating film which can form, by the printing method, fine insulating film patterns necessary for formation of highly integrated organic transistors. A third purpose of the invention is to provide an insulating film which is formed from the ink composition.

Means for Solving the Problems

In order to achieve the above purposes, first, the invention provides an ink composition, which forms an insulating film, wherein the ink composition includes, as essential components, an organic solvent, a polyvinylphenol-based resin, an epoxy resin, and a cross-linking aid. Second, the invention provides an ink composition, which forms an insulating film, wherein the ink composition can form fine insulating film patterns, and the organic solvent includes an organic solvent which has a vapor pressure of $11.3 \times 10^2$ Pa or higher at 20° C. and a boiling point of lower than 115° C. under atmospheric pressure and an organic solvent which has a vapor pressure of less than $11.3 \times 10^2$ Pa at 20° C. and a boiling point of 115° C. or higher under atmospheric pressure; the ink composition includes a extender component having a volume average particle diameter of 1 nm to 150 nm and a silicone-based releasing component, the ink surface tension is 17 mN/m to 30 mN/m at 25° C., and the ink viscosity is 0.5 mPa·s to 30 mPa·s. Third, the invention provides an insulating film formed from the ink composition for forming an insulating film.

Effects of the Invention

By using the ink composition for forming an insulating film of the invention, it is possible to obtain an excellent property of the insulating film at a calcination temperature of 100° C. to 140° C., and to form the insulating film on a flexible substrate such as a PEN. Also, the insulating film formed has solvent resistance, and it is possible to laminate a conductive layer, semiconductor layer and other layers on the insulating film by the printing method. In addition, since leakage current is small, it is possible to properly use the insulating film as a gate insulating film for an organic field-effect transistor (OFET) or the like.

BRIEF DESCRIPTION OF THE DRAWINGS

FIG. 1 is a schematic configuration view which shows an example of an electronic device wherein the insulating film, of the invention is used.

MODE FOR CARRYING OUT THE INVENTION

The ink composition for forming an insulating film of the invention includes, as essential components, an organic solvent, a polyvinylphenol-based resin, an epoxy resin, and a cross-linking aid.

As organic solvents used for the ink composition for forming an insulating film of the invention, any solvent which dissolves the polyvinylphenol-based resin can be used. Examples thereof include aliphatic hydrocarbon-based organic solvents such as pentane, hexane, heptane, octane, decane, dodecane, isopentane, isohexane, isooctane, cyclohexane, methylcyclohexane, and cyclopentane; aromatic hydrocarbon-based solvents such as benzene, toluene, o-xylene, m-xylene, p-xylene, ethylbenzene, mesithylene, naphthalene, cyclohexylbenzene, and diethylenebenzene; ester-based solvents such as methyl formate, ethyl formate, propyl formate, methyl acetate, ethyl acetate, isopropyl acetate, n-propyl acetate, isobutyl acetate, n-butyl acetate, methyl propionate, and ethyl propionate; alcohol-based solvents such as methanol, ethanol, propanol, isopropanol, sec-butanol tert-butanol, cyclohexanol, and α-terpineol; ketone-based solvents such as acetone, methyl ethyl ketone, methyl isobutyl ketone, cyclohexanone, 2-hexanone, 2-heptanone, 2-octanone, tetrahydrofuran; carbonates such as ethylene carbonate and propylene carbonate; alkylene glycol-based solvents such as diethylene glycol ethylether, diethylene glycol diethylether, propylene glycol monomethylether, propylene glycol monoethylether, propylene glycol monopropylether, propylene glycol monobutylether, propylene glycol monomethylether acetate, diethylene glycol methylether acetate, diethylene glycol ethylether acetate, diethylene glycol propylether acetate, diethylene glycol isopropylether acetate, diethylene glycol butylether acetate, diethylene glycol t-butylether acetate, triethylene glycol methylether acetate, triethylene glycol ethylether acetate, triethylene glycol propylether acetate, triethylene glycol isopropylether acetate, triethylene glycol butylether acetate, triethylene glycol t-butylether acetate, dipropylene glycol dimethylether, and dipropylene glycol monobutylether, ether-based solvents such as diethylether, dipropylether, diisopropylether, dibutylether, dihexylether, ethylvinylehter, butylvinylehter, anisole, butylphenylether, pentylphenylether, methoxytoluene, benzylethylether, diphenylether, dibenzylether, dioxane, furan, and tetrahydrofurane, and amid solvents such as N,N-dimethylformamide, N,N-dimethylacetamide, and N-methylpyrrolidone. However, organic solvent is not particularly limited to these solvents. These solvents can be used alone or in combination of two or more kinds thereof.

Examples of the polyvinylphenol-based resin used for the ink composition for forming an insulating film of the invention includes p-vinylphenol homopolymer; copolymer of p-vinylphenol with other vinyl monomers (for example, methyl methacrylate, 2-hydroxylethyl methacrylate, styrene, butyl acrylate, 2-hydroxylethyl acrylate, phenylmaleimide, maleic acid, and fumaric acid); homopolymer of bromine-substituted p-vinylphenol obtained by substituting p-vinylphenol with bromine; copolymer of bromine-substituted p-vinylphenol with other vinyl resins; homopolymer of p-vinylphenol derivatives obtained by sulfonating, t-butylating, or aminating p-vinylphenol; copolymer of p-vinylphenol derivatives with other vinyl monomers. However, polyvinylphenol-based resin is not particularly limited to the resins. These resins can be used alone or in combination of two or more kinds thereof. In the invention, the content of the polyvinylphenol-based resin, is preferably 10% by mass or more, and more preferably 25% by mass or more, based on the total solid content of the ink composition for forming an insulating film excluding extender pigment.

Epoxy resin, which is used for the ink composition for forming an insulating film of the invention, functions as a cross-linking agent for polyvinylphenol-based resin, and any known and widely used epoxy resin having two or more reactable functional epoxy groups may be used. Examples thereof include bisphenol A-type epoxy resin, bisphenol F-type epoxy resin, polyfunctional epoxy resin, flexible epoxy resin, brominated epoxy resin, glycidyl ester-type epoxy resin, polymer-type epoxy resin, or biphenyl-type epoxy resin. However, epoxy resin is not particularly limited to these resins. These resins can be used alone or in combination of two or more kinds thereof.

The ink composition for forming an insulating film of the invention uses a cross-linking aid. Examples of the cross-linking aid include widely known and used cross-linking aids may be used, in addition to amine compounds, polyamide resins, imidazoles, polymercaptans, bromine trifluorides, dicyandiamides, organic acid hydrides, and triphenylphosphine. These cross-linking aids can be used alone or in combination of two or more kinds thereof. From the viewpoint of stability at a room temperature and curing at a low temperature of 150° C. or lower, 2-ethyl-4-methyl imidazole is preferable. The content of the cross-linking aid is 0.3% to 10.0% by mass, and preferably 1.0% to 5.0% by mass, based on the total solid content. If the content thereof is out of the above range and is too small, curing is insufficient. If the content thereof is too large, the cross-linking aid having strong polarity remains in the obtained insulating resin film, thereby leading to a problem of inhibiting insulating property, and thus is not preferable. When extender components described later are added, the content of the cross-linking aid is 0.3% to 10.0% by mass, and preferably 1.0% to 5.0% by mass, based on the total solid content excluding the extender component.

The ink composition for forming an insulating film of the invention can be used by adding, if necessary, releasing agents, extender components, various surfactants which are mainly used for adjusting ink surface tension or improving a leveling property, or the like.

As the surfactants, hydrocarbon-based surfactants, silicone-based surfactants, fluorine-based surfactants, and mixtures of two or more kinds thereof can be used. Particularly, fluorine-based surfactant is excellent in adjusting ink surface tension and effective in improving leveling property. In addition, the insulating film formed from the ink having the fluorine-based surfactant added thereto is excellent in terms of compatibility with crystalline organic semiconductors such as polythiophene. Therefore, the fluorine-based surfactant is the most preferable surfactant, since the surfactant can be expected to improve transistor characteristics as well as ink properties. Among the fluorine-based surfactants, the surfactant which has a linear perfluoroalkyl group and chain length of C6 or more is preferable, and the nonionic fluorine-haled surfactant with C8 or more is more preferable. Specific examples thereof include MEGAFAC F-482, MEGAFAC F470 (R-08), MEGAFAC F472SF, MEGAFAC R-30, MEGAFAC F-484, MEGAFAC F-486, MEGAFAC F172D, MEGAFACE F178RM (all trade names, manufactured by DIC Corporation). However, the surfactant is not particularly limited thereto. Also these surfactants can be used alone or in combination of two or more kinds thereof. The content of the surfactants are, as active ingredients, 0.01% to 5.0% by mass, and preferably 0.05% to 1.0% by mass, based on the total ink composition.

Examples of substrates for forming electronic devices include glass fiber reinforced plastic such as a glass woven fabric epoxy plate, a glass non-woven fabric epoxy-laminated plate, a paper epoxy-laminated plate, a paper phenol-laminated plate, and a glass woven fabric polyimide-laminated plate; plastic films such as polyethylene naphthalate, polyimide, polyethylene terephthalate, and polycarbonate; metal foils and metal plates such as copper coated with insulant, aluminum, stainless steel, or iron; or plate-like glass, alumina, zirconia, and silica. It is possible to promote a curing property at low temperature, which is a characteristic of the invention, by using flexible plastic materials such as polyethylene naphthalate, polyethylene terephthalate, and polycarbonate, in particular.

In order to make the ink composition for forming an insulating film of the invention into a film, various printing methods can be employed. Widely known and used printing methods and methods for producing coated substances with a single layer or multiple layer structure can be employed. Specifically, examples of such methods include a gravure method, an offset method, a letterpress plate method, a screening method, a reversing method, an air doctor coating method, a blade coating method, an air knife coating method, a squeeze coating method, an immersion coating method, a transfer roller coating method, a kiss coating method, a cast coating method, a spray coating method, a die method, a spin coating method, a bar coating method, a micro contact method, and a letterpress plate reverse printing method. The ink composition of the invention includes proper additives, selects proper solvents, and is produced with the proper resin component concentration, depending on each of the printing methods.

Among the printing methods, in order to form precise circuits, the letterpress plate reverse printing method which can pattern, for example, fine lines with good reproduction are more preferably used. The letterpress plate reverse printing method herein is a method which includes coating ink on a smooth surface which has a releasing property and consists of polydimethylsiloxane (PDMS) or the like, pressing a letterpress plate serving as a stamp plate on the ink-coated surface, removing an ink portion contacting the letterpress plate from the surface having the releasing property, and reversely transferring the remaining pattern to a substance to be printed. For the ink applied to this method, it is required that the ink can evenly wet the surface having the releasing property, and can be cleanly removed from the surface having the releasing property as the pattern of the letterpress plate by pressing the letterpress plate. Also, it is required that the remaining ink pattern is completely transferred from the surface having the releasing property to a substance to be printed without leaving a residue. The ink composition for forming an insulating film of the invention, which is suitable for this printing method, preferably includes two or more kinds of quick drying or slow drying solvents, extender components, surface energy adjusting agents, and releasing agents, in addition to the essential components. By adding these components, it is possible to improve an ink printing property, and to realize a fine pattering property which is necessary for constructing an electronic device such as an organic transistor.

As the quick drying organic solvent, one or more solvents which have vapor pressure of $11.3 \times 10^2$ Pa (8.5 mmHg) or higher at 20° C. and a boiling point of lower than 115° C. under atmospheric pressure can be used. The content of the quick drying organic solvent is 5.0% to 90.0% by mass, preferably 10.0% to 60.0% by mass, and more preferably 20.0% to 40.0% by mass, based on the total ink composition.

The quick drying organic solvent is selected depending on the solubility of the resin, and the affinity for the pigment dispersing system. Examples thereof include ester-based solvents such as ethyl acetate, normal propyl acetate and isopropyl acetate; alcohol-based solvents such as methanol, ethanol, 1-propanol, and 2-propanol; hydrocarbon-based solvents such as pentane, hexane, cyclohexane, methylcyclohexane, toluene, and xylene; ketone-based solvents such as tetrahydrofuran. The solvent can be used as a mixture of solvents from the single category or a mixture of solvents from the plural category. Among the solvents, isopropyl acetate, ethanol, and 2-propanol are preferable in terms of the evaporation rate and surface tension thereof.

As the slow drying organic solvent, any one or more solvents which have vapor pressure of less than $11.3 \times 10^2$ Pa (8.5 mmHg) at 20° C. and a boiling point of 115° C. or higher under atmospheric pressure can be used. The content of the slow drying organic solvent is 5.0% to 90.0% by mass, preferably 30.0% to 70.0% by mass, and more preferably 40.0% to 60.0% by mass, based on the total ink composition. These solvents are selected depending on the solubility of the resin, and the affinity for the pigment dispersing system. Examples thereof include ester-based solvents such as propylene glycol monomethyl ether acetate (PGMAc), 3-methoxy-3-methylbutyl acetate, and ethoxyethyl propionate (EEP); alcohol-based solvents such as 1-butanol, DIADOL135 (trade name, manufactured by Mitsubishi Rayon Co., Ltd), 3-methoxy-3-methyl-1-butanol, 1-hexanol, 1,3-butanediol, 1-pentanol, 2-methyl-1-bunanol, and 4-methyl-2-pentanol; ether-based solvents such as propylene glycol monomethyl ether, propylene glycol monoethyl ether, propylene glycol tertiary butyl ether, dipropylene glycol monomethyl ether, ethylene glycol butyl ether, ethylene glycol ethyl ether, ethylene glycol methyl ether, diethylene glycol butyl ether, and diethylene glycol ethyl ether; and carbonate esters such as ethylene carbonate and propylene carbonate, hydrocarbon-based solvents such as SOLVESSO 100 and SOLVESSO 150 (trade names, manufactured by ExxonMobil Chemical). These solvents can be used as a mixture of solvents from the single category, or a mixture of solvents from the plural category. Among the solvents, propylene glycol monomethyl ether acetate, 3-methoxy-3-methyl-butyl acetate, ethoxyethyl propionate, and DIADOL 135 are preferable in terms of the evaporation rate and the surface tension thereof.

As the releasing agent, one or two or more kinds of known and widely used silicone-based compounds can be used. Specific examples thereof include dimethyl silicone oil, dimethyl silicone rubber, silicone resin, organic modified silicone, methylphenyl silicone oil, long-chain alkyl modified silicone oil, a mixture of a fluorine compound and a silicone polymer, and a fluorine modified silicone. However, the releasing agent is not particularly limited thereto. Also these agents can be used alone or in combination of two or more kinds thereof. Among the agents, KF-96L series (trade name, manufactured by Shin-Etsu Chemical Co., Ltd.) are preferable in terms of the releasing property and compatibility with PVP resin. The content of the releasing agents is 0.0% to 5.0% by mass, preferably 0.0% to 1.0% by mass, based on the entire ink composition. If the content is out of the above range and too large, not only does the printing property decrease, but the problem of inhibiting insulating the film property occurs, and thus is not preferable.

As extender components, one or two or more kinds of widely known and used a single color pigment, a single fine-particle powder, and a pigment dispersion obtained by dispersing the single color pigment or a single fine-particle powder in a dispersant or an organic solvent in advance can be used, as long as the components can maintain the insulating property of the coated film Specific examples thereof include EXCEDIC BLUE0565, EXCEDIC RED0759, EXCEDIC YELLOW0599, EXCEDIC GREEN0358, and EXCEDIC YELLOW0648 (all trade names, manufactured by DIC Corporation); AEROSIL series (trade name, manufactured by Evonik Industries); SILYSIA, SYLOPHOBIC, SYLOPUTE, SYLOPAGE, SYLOPURE, SYLOSPHERE, SYLOMASK, SILWELL, and FUJI BALLOON (all trade names, manufactured by FUJI SILYSIA CHEMICAL LTD.); PMA-ST, and IPA-ST (all trade names, manufactured by Nissan Chemical Industries Ltd.); NANOBIC3600 series and NANOBIC3800 series (all trade names, manufactured by Byk Additives & Instruments). However, extender component is not particularly limited to these materials. These components can be used alone or in combination of two or more kinds thereof. In order to improve the insulating property of the insulating film, it is preferable that these extender components inherently have a high electrical insulating property, and are homogenously and densely dispersed in the insulating film. When the insulating ink of the invention is applied to a gate insulating film of an electronic device, such as an organic transistor, a high level of surface smoothness of the film is required. Consequently, average particle diameter of the extender components to be added to ink is preferably 1 nm to 150 nm, and more preferably 5 nm to 50 nm. PMA-ST, IPA-ST (trade names, manufactured by Nissan Chemical Industries Ltd.), and NANOBIC3600 series (trade name, manufactured by Byk Additives & Instruments), which are fine particle silica dispersion or alumina dispersion, are preferable. The average particle diameter of the extender components can be easily measured by, for example, a dynamic light scattering method. The content of the extender components is 20% to 90% by mass, and preferably 40% to 70% by mass, based on the total solid content. If the content is out of the above range and is too large, the insulating film becomes brittle, and thus is not preferable. On the other hand, if the content is too small, the fine patterning property of ink becomes insufficient, and thus is not preferable.

In the ink composition of the invention, although ink appropriate to the letterpress plate reverse printing method includes the above-described composition, a physical property of the ink is also an important factor. As the important physical property of ink, first, the ink viscosity at a temperature of 25° C. is within in a range of 0.5 mPa·s to 30.0 mPa·s. Within the range, a viscosity of 1.0 mPa·s to 5.0 mPa·s is more preferable. Second, the surface energy of the ink composition is also an important factor. The surface energy of the ink composition is preferably 17 to 30 mN/m, but generally, a surface energy of less than 22 mN/m is preferable.

EXAMPLE

Hereinafter, the invention is more specifically described with experimental examples, but the invention is not limited to the following experimental examples.

Example 1

Ink of Example 1 was prepared by mixing 2.3 g of MARUKA LYNCUR-M (manufactured by Maruzen Petrochemical Co, Ltd) as a polyvinylphenol-based resin, 3.3 g of an epoxy resin EPICLON 850CPR (manufactured by DIC Corporation) as a cross-linking agent, 0.14 g of 2-ethyl-4-methylimidazole as a cross-linking aid, and 22.0 g of isopropyl acetate (hereinafter referred to as IPAc) as a solvent.

Example 2

Ink of Example 2 was prepared by mixing 2.3 g of poly(4-vinylphenol-co-methylmethacrylate) (manufactured by Sigma-Aldrich Co.) as a polyvinylphenol-based resin, 3.3 g of an epoxy resin EPICLON 850CPR (manufactured by DIC Corporation) as a cross-linking agent, 0.06 g of 2-ethyl-4-methylimidazole as a cross-linking aid, 22.0 g of cyclohexanone as a solvent, and 0.5 g of F-482 as a fluorine-based surfactant.

Example 3

Ink of Example 3 was prepared by mixing 2.3 g of MARUKA LYNCUR-M (manufactured by MARUZEN PETROCHEMICAL CO, LTD) as a polyvinylphenol-based resin, 3.3 g of an epoxy resin EPICLON 850CPR (manufactured by DIC Corporation) as a cross-linking agent, 0.15 g of a 2-ethyl-4-methylimidazole as a cross-linking aid, 15 g of IPAc as a solvent, 29 g of a propylene glycol monomethyl ether, 6.0 g of propylene carbonate, 2.0 g of KF96L-1cs (manufactured by Shin-Etsu Chemical Co., Ltd.) as a releasing agent, 1.0 g of F-482 (manufactured by DIC Corporation) and 0.3 g of MCF-350SF (manufactured by DIC Corporation) as fluorine-based surfactants; and 25 g of PMA-ST (manufactured by Nissan Chemical Industries Ltd.) as a extender component.

Comparative Example 1

Ink of Comparative Example 1 was prepared by mixing a polyvinylphenol-based resin as a resin component, 20.0 g of polymethyl methacrylate (PMMA) (manufactured by Sigma-Aldrich Co.: Mw 120,000) which was an acrylic resin used instead of an epoxy resin, 80.0 g of solvent cyclohexanone.

Comparative Example 2

Ink of Comparative Example 2 was prepared by mixing a polyvinylpehnol-based rein as a resin component, 20.0 g of a polystyrene resin (manufactured by Sigma-Aldrich Co.: Mw 44,000) which was used instead of an epoxy resin, 80.0 g of a solvent cyclohexanone.

Comparative Example 3

Ink of Comparative Example 3 was prepared by mixing 20.0 g of MARUKA LYNCUR-M (manufactured by Maruzen Petrochemical Co, Ltd) as polyvinylphenol-based resin, 8.0 g of CYMEL-303 (manufactured by Nihon Cytec Industries Inc.) which was a cross-linking agent used instead of an epoxy resin, 100.0 g of a solvent cyclohexanone.

Comparative Example 4

Ink of Comparative Example 4 was prepared by mixing 1.9 g of a phenol novolac resin (PHENOLITE TC-2090-60M: a solid content of 60% MEK solution), 2.0 g of an epoxy resin EPICLON 850CPR (manufactured by DIC Corporation), 0.1 g of 2-ethyl-4-methyl imidazole as a cross-linking aid, 4.0 g of isopropyl acetate (hereinafter referred to as IPAc) as a solvent, and 3.8 g of methyl ethyl ketone.

(Evaluation of Solvent Resistance)

The inks obtained in the above Example 1 to Comparative Example 3 were made into films on the glass plates having thickness of 1.5 mm by a spin coater printing method so that the dried film thickness became 1 μm. Thereafter, the films were calcinated at 140° C. for 30 minutes to form samples for solvent resistance evaluation. The solvent resistance evaluation was performed by immersing the respective glass plates on which the thin film formed as described above into butyl carbitol acetate for 20 hours and checking whether the thin film remained. The results are shown in Table 1 and Table 2.

(Evaluation of Leakage Current)

In the same manner used for the sample for solvent resistance evaluation, the insulating film having a dried film thickness of about 1 μm was obtained by printing the respective ink composition on ITO-applied glass plates having thickness of 1.5 mm and calcinating at 140° C. for 30 minutes. Silver electrodes were formed on the insulating film by a vacuum deposition method, and current values at the time of applying 150V to the insulating film were measured. The unit is mAcm$^{-2}$.

(Image Quality of a Reverse-Printed Substance)

An image was formed by forming insulating ink-coated film on a PDMS surface of blanket by using the ink of Example 3, pressing the letterpress glass plate serving as a stamp plate on the coated film, removing extra ink to form a grid pattern having a line width of 20 μm on the blanket, and then transferring this pattern on a glass plate which was used as a substrate to be printed. The quality of the image formed on the glass plate was observed with an optical microscope, and it was evaluated whether the pattern of the letterpress plate was accurately reproduced. The results are shown in Table 1.

(Evaluation of Transistor Property)

A device for measuring a transistor property, which has a bottom-gate bottom-contact (BGBC) structure shown in FIG. 1, was prepared.

(1) Formation of gate electrode: A hard coat-applied PEN film having thickness of about 125 μm was cut into the predetermined size, conductive ink having silver nanoparticles evenly dispersed therein was evenly applied on the film by spin coating, and the resultant was calcinated in a clean oven at 150° C. for 40 minutes.

(2) Formation of insulating film: A gate insulating film having thickness of about 1 μm was formed by applying the ink for forming an insulating film of the invention by spin coating on the gate electrode formed from the conductive ink, and subjecting the resultant to thermal treatment in a clean oven at 140° C. for about 1 hour.

(3) Formation of source and drain electrodes: Silver electrodes were formed by forming a source and drain electrode pattern having a channel length of 50 μm and width of 4 mm on the gate insulating film formed as above, by the letterpress plate reverse printing using conductive ink for reverse printing, and calcinating the resultant in a clean oven at 170° C. for 40 minutes.

(4) Formation of organic semiconductor layer: P3HT thin film was formed on the insulating film, source and drain electrodes by spin coating and using 0.5% by weight of a xylene solution having an organic semiconductor Poly(3-hexylthiophene) (P3HT) therein.

(5) The prepared device was subjected to thermal treatment in a glow box at 150° C. for about 5 minutes. Thereafter, Id-Vg and Id-Vd properties of the device were measured using a semiconductor parameter measuring apparatus (Keithley Instrument Inc., 4200). The degree of field-effect mobility and ON/OFF ratio were measured by a known method. The unit of degree of mobility is cm$^2$/Vs.

TABLE 1

| | Example | | |
|---|---|---|---|
| | 1 | 2 | 3 |
| Solvent resistance | ◯ (Good) | ◯ (Good) | ◯ (Good) |
| Leakage current | <10$^{-5}$ | <10$^{-5}$ | <10$^{-5}$ |
| Image quality of a reverse-printed substance | — | — | ◯ (Good) |
| FET mobility | 6.0 × 10$^{-4}$ | 1.2 × 10$^{-3}$ | 7.3 × 10$^{-4}$ |
| ON/OFF ratio | 8 × 10$^3$ | 1 × 10$^5$ | 1 × 10$^4$ |

TABLE 2

| | Comparative Example | | | |
|---|---|---|---|---|
| | 1 | 2 | 3 | 4 |
| Solvent resistance | X (Poor) | X (Poor) | Defective curing | ◯ (Good) |
| Leakage current | <10$^{-5}$ | <10$^{-5}$ | <10$^{-4}$ | <10$^{-4}$ |
| Image quality of a reverse-printed substance | — | — | — | — |
| FET mobility | — | — | — | 8 × 10$^5$ |
| ON/OFF ratio | — | — | — | 1 × 10$^3$ |

INDUSTRIAL APPLICABILITY

The ink composition for forming an insulating film of the invention can be calcinated at low temperature, and applied to the production of an electronic device having a flexible film as the substrate.

REFERENCE SIGNS LIST

1. Substrate
2. Gate electrode

3. Insulating film
4. Organic semiconductor layer
5. Source and drain electrodes

The invention claimed is:

1. An ink composition which forms an insulating film of an organic transistor, wherein the ink composition comprises an organic solvent, a polyvinylphenol-based resin, an epoxy resin, a cross-linking aid and a fluorine-based surfactant, which has a linear perfluoroalkyl group and has a chain length in the range of C6 to C8; wherein
the cross-linking aid is imidazoles.

2. The ink composition which forms an insulating film according to claim 1, wherein when voltage of 150V is applied to a cured film having a thickness of 1 μm which is obtained from the ink composition, leakage current is $10^{-5}$ mA/cm$^{-2}$ or less.

3. The ink composition which forms an insulating film according to claim 1,
wherein the organic solvent includes a first organic solvent which has vapor pressure of $11.3 \times 10^2$ Pa or higher at 20° C. and a boiling point of lower than 115° C. under atmospheric pressure, and a second organic solvent which has a vapor pressure of less than $11.3 \times 10^2$ Pa at 20° C. and a boiling point of 115° C. or higher under atmospheric pressure; and
the ink composition includes 5.0% to 90.0% by mass of the first organic solvent, and 5.0% to 90.0% by mass of the second organic solvent.

4. The ink composition which forms an insulating film according to claim 1, wherein the ink composition includes 0.01% to 5.0% by mass of the fluorine-based surfactant based on the total ink composition.

5. The ink composition which forms an insulating film according to claim 1,
wherein the ink composition is used in a letterpress plate reverse printing method, and the organic solvent includes a first organic solvent which has vapor pressure of $11.3 \times 10^2$ Pa or higher at 20° C. and a boiling point of lower than 115° C. under atmospheric pressure and a second organic solvent which has a vapor pressure of less than $11.3 \times 10^2$ Pa at 20° C., and a boiling point of 115° C. or higher under atmospheric pressure;
the ink composition includes a extender component having a volume average particle diameter of 1 nm to 150 nm and a silicone-based releasing component;
an ink surface tension is 17 mN/m to 30 mN/m at 25; and
an ink viscosity is 0.5 mPa·s to 30 mPa·s.

6. The ink composition which forms an insulating film according to claim 5, wherein when voltage of 150V is applied to a cured film having a thickness of 1 μm which is obtained from the ink composition, leakage current is $10^{-5}$ mA/cm$^{-2}$ or less.

7. The ink composition according to claim 5, wherein the content of the cross-linking aid is 0.3% to 10.0% by mass based on the total solid content of the ink composition excluding the extender component.

8. An insulating layer formed from the ink composition according to claim 1.

9. A forming method of an insulating film, comprising;
printing the ink composition according to claim 1, and
drying the printed composition to form an insulating film.

10. A manufacturing method of an organic transistor including an insulating film, comprising:
printing the ink composition according to claim 1; and
drying the printed composition to form an insulating film.

11. The manufacturing method according claim 10, wherein the printing step is performed by a letterpress plate reverse printing.

12. An insulating layer formed from the ink composition according to claim 5.

13. An ink composition which forms an insulating film of an organic transistor,
wherein the ink composition comprises an organic solvent, a polyvinylphenol-based resin, an epoxy resin, a cross-linking aid and a fluorine-based surfactant, which has a linear perfluoroalkyl group and has a chain length in the ranges of C6 to C8;
wherein
the cross-linking aid includes at least one selected from the group consisting of amine compounds, polyamide resins, imidazoles, polymercaptans, bromine trifluorides, dicyandiamides, organic acid hydrides and triphenylphosphine;
the organic solvent includes a first organic solvent which has vapor pressure of $11.3 \times 10^2$ Pa or higher at 20° C. and a boiling point of lower than 115° C. under atmospheric pressure and a second organic solvent which has a vapor pressure of less than $11.3 \times 10^2$ Pa at 20° C., and a boiling point of 115° C. or higher under atmospheric pressure;
an ink surface tension of the ink composition is 17 mN/m to 30 mN/m at 25° C.; and
an ink viscosity of the ink composition is 0.5 mPa·s to 30 mPa·s.

14. The ink composition according claim 13, wherein the ink composition includes 5.0% to 90.0% by mass of the first organic solvent, 5.0% to 90.0% by mass of the second organic solvent, an extender component having a volume average particle diameter of 1 nm to 150 nm, wherein the content of the extender component is 20% to 90% by mass based on the total solid content of the composition and the volume average particle diameter is obtained by a dynamic light scattering method, and 0.0% to 5.0% by mass of a silicone-based releasing component.

15. The ink composition according to claim 13, wherein content of the cross-linking aid is 0.3% to 10.0% by mass based on the total solid content of the ink composition excluding the extender component.

16. The ink composition according to claim 13, wherein the content of the cross-linking aid is 0.3% to 10.0% by mass based on the total solid content of the ink composition excluding the extender component, and
the ink composition includes 5.0% to 90.0% by mass of the first organic solvent, 5.0% to 90.0% by mass of the second organic solvent, an extender component having a volume average particle diameter of 1 nm to 150 nm, wherein the content of the extender component is 20% to 90% by mass based on the total solid content of the composition and the volume average particle diameter is obtained by a dynamic light scattering method, and 0.0% to 5.0% by mass of a silicone-based releasing component.

17. The ink composition which forms an insulating film according to claim 13, wherein the ink composition includes 0.01% to 5.0% by mass of the fluorine-based surfactant based on the total ink composition.

18. The ink composition which forms an insulating film according to claim 13, wherein the cross-linking aid is imidazoles.

* * * * *